(12) United States Patent
Jiang

(10) Patent No.: US 12,426,175 B2
(45) Date of Patent: Sep. 23, 2025

(54) ROLLABLE FLEXIBLE DISPLAY DEVICE AND TERMINAL EQUIPMENT

(71) Applicants: WUHAN CHINA STAR OPTOELECTRONICS TECHNOLOGY CO., LTD., Wuhan (CN); WUHAN CHINA STAR OPTOELECTRONICS SEMICONDUCTOR DISPLAY TECHNOLOGY CO., LTD., Wuhan (CN)

(72) Inventor: Guobao Jiang, Wuhan (CN)

(73) Assignees: WUHAN CHINA STAR OPTOELECTRONICS TECHNOLOGY CO., LTD., Wuhan (CN); WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/605,554

(22) PCT Filed: Aug. 11, 2021

(86) PCT No.: PCT/CN2021/111988
§ 371 (c)(1),
(2) Date: Feb. 2, 2023

(87) PCT Pub. No.: WO2023/004886
PCT Pub. Date: Feb. 2, 2023

(65) Prior Publication Data
US 2024/0023256 A1     Jan. 18, 2024

(30) Foreign Application Priority Data

Jul. 28, 2021 (CN) .......................... 202110857383.4

(51) Int. Cl.
*H05K 5/02* (2006.01)

(52) U.S. Cl.
CPC .................................. *H05K 5/0217* (2013.01)

(58) Field of Classification Search
CPC ........................... H05K 5/0017; H05K 5/0217
(Continued)

(56) References Cited

U.S. PATENT DOCUMENTS

| 11,526,198 B1 * | 12/2022 | Kanas | .................... G06F 1/1624 |
| 2018/0103550 A1 * | 4/2018 | Seo | ........................ H01F 7/0205 |

(Continued)

FOREIGN PATENT DOCUMENTS

| CN | 205264268 U | 5/2016 | |
| CN | 106884867 A * | 6/2017 | .............. F16C 11/12 |

(Continued)

OTHER PUBLICATIONS

Chinese Office Action in corresponding Chinese Patent Application No. 202110857383.4 dated Jan. 10, 2022, pp. 1-9.

*Primary Examiner* — Hung S. Bui
(74) *Attorney, Agent, or Firm* — PV IP PC; Christopher S. Ruprecht; Wei Te Chung

(57) ABSTRACT

The present application provides a rollable flexible display device and a terminal equipment. The rollable flexible display device includes: a flexible screen; a rolling mechanism in which opposite ends of the flexible screen are respectively wound in the rolling structure; and a supporting mechanism including a first supporting member, a second supporting member, and a third supporting member, the second and third supporting members are respectively fixed on the rolling mechanism, the second and third support members are respectively embedded in the first support member; and a transmission mechanism fixed on the supporting mechanism and driving the second and the third (Continued)

support members to move synchronously in the first supporting member.

14 Claims, 7 Drawing Sheets

(58) Field of Classification Search
USPC .......................................................... 361/807
See application file for complete search history.

(56) References Cited

U.S. PATENT DOCUMENTS

| | | | |
|---|---|---|---|
| 2019/0250669 A1* | 8/2019 | Liao | G04G 17/045 |
| 2021/0307182 A1* | 9/2021 | Feng | H05K 5/0217 |
| 2021/0375165 A1* | 12/2021 | Feng | G09F 9/301 |
| 2024/0023255 A1* | 1/2024 | Wang | G06F 1/1652 |

FOREIGN PATENT DOCUMENTS

| | | | | |
|---|---|---|---|---|
| CN | 107067981 A | | 8/2017 | |
| CN | 107820399 A | | 3/2018 | |
| CN | 111664337 A | | 9/2020 | |
| CN | 111833743 A | | 10/2020 | |
| CN | 212010178 U | * | 11/2020 | ........... G06F 1/1624 |
| CN | 212627978 U | * | 2/2021 | ........... G06F 1/1652 |
| CN | 112530286 A | | 3/2021 | |

\* cited by examiner

ROLLABLE FLEXIBLE DISPLAY DEVICE AND TERMINAL EQUIPMENT

RELATED APPLICATIONS

This application is a Notional Phase of PCT Patent Application No. PCT/CN2021/111988 having international filing date of Aug. 11, 2021, which claims the benefit of priority of Chinese Patent Application No. 202110857383.4 filed on Jul. 28, 2021. The contents of the above applications are all incorporated by reference as if fully set forth herein in their entirety.

BACKGROUND OF INVENTION

Field of Invention

The present application relates to a field of flexible display technology, and in particular to a rollable flexible display device and a terminal equipment.

Description of Prior Art

The flexible display device application market is increasingly favored by the market, and flexible screen mobile phones are one of the more commonly used flexible display devices. A flexible screen mobile phone refers to a mobile phone with a bendable and flexible screen. Compared with traditional screens, flexible screens have obvious advantages, not only providing users with brand-new use effects, but also smaller in size and lower in power consumption, and at the same time, the screen is flexible and reduces risk of screen cracking.

With development of flexible displays, various forms of flexible display devices have emerged, such as foldable display devices, slidable display devices, and rollable display devices. As a new flexible display means, a rollable display device can avoid complicated and low-life hinge members of the foldable display device, and therefore, the rollable display device has great application value. The existing foldable display device has two display states, wherein a display area of a second display state (unfolded state) is twice a display area of a first display state (folded state). The existing rollable display device generally only has two states: fully rolled up and fully stretched, and the rollable display device can display normally only when it is in the fully stretched state, that is, the existing rollable display device has only one display state.

Accordingly, the existing rollable display device cannot have characteristics of the foldable display device.

SUMMARY OF INVENTION

In order to solve the above problems, technical solutions provided by the present application are as follows:

The present application provides a rollable flexible display device, including:
a flexible screen;
two rolling mechanisms, wherein opposite ends of the flexible screen are respectively wound in the two rolling mechanisms;
a supporting mechanism including a first supporting member, a second supporting member, and a third supporting member, wherein one end of the second supporting member and one end of the third supporting member are respectively fixed on one of the rolling mechanisms, the second supporting member and the third supporting member are respectively embedded in the first supporting member; and
a transmission mechanism fixed on the supporting mechanism and capable of driving the second supporting member and the third supporting member to synchronously telescope in opposite directions inside the first supporting member.

In an optional embodiment of the present application, the transmission mechanism includes:
transmission assembly, wherein one end of the transmission assembly is fixed on the third supporting member, and another end of the transmission assembly is fixed on the first supporting member; and
sliding assembly, wherein one end of the sliding assembly is fixed on the transmission assembly, and another end of the sliding assembly is fixed on the second supporting member,
wherein the transmission assembly is capable of driving the third supporting member to telescope inside the first supporting member, and driving the sliding assembly to telescope inside the first supporting member through the second supporting member.

In an optional embodiment of the present application, the transmission assembly includes:
two first transmission members, wherein each of the first transmission members includes a rack and an active gear meshed with the rack, the rack is fixed on the third supporting member, and the active gear is fixed on the first supporting member; and
two second transmission members, wherein each of the second transmission members includes a first young gear, a second young gear, and a screw rod, the first young gear is fixed on the active gear, the second young gear is fixed at one end of the screw rod and meshed with the first gear, opposite ends of the sliding assembly are respectively screwed on two of the screw rod, and the active gear drives the sliding assembly to slide on the screw rod through the first gear and the second gear.

In an optional embodiment of the present application, a sliding direction of each of the second supporting member and the third supporting member in the first supporting member is defined as a first direction, and the rack and the screw rod extend in the first direction, the sliding assembly extends in a second direction perpendicular to the first direction, the active gear is connected to the active gear and the first gear through a transmission shaft, and the transmission shaft extends in the second direction.

In an optional embodiment of the present application, the supporting mechanism further includes a middle frame;
the first supporting member is fixed on the middle frame and includes a first slide and a second slide;
the second supporting member includes a plurality of second supporting ribs arranged in parallel at intervals, each of the second supporting ribs is embedded in the first slide and slidable in the first slide; and
the third supporting member includes a plurality of third supporting ribs arranged in parallel at intervals, and each of the third supporting ribs is embedded in the second slide and slidable in the second slide.

In an optional embodiment of the present application, the first supporting member further includes a plurality of first supporting ribs, and opposite ends of the plurality of first supporting ribs are respectively fixed on the middle frame, the plurality of the first supporting ribs are arranged in parallel at intervals to form the first slide and the second slide between adjacent ones of the first supporting ribs, and the first slide and the second slide are arranged at intervals.

In an optional embodiment of the present application, the third supporting member further includes two fourth supporting ribs, the plurality of the third supporting ribs are located between the two fourth supporting ribs, two of the rack are respectively fixed on the two fourth supporting ribs, and any one of outermost two of the first supporting ribs is located between one of the outermost two of the second supporting ribs and one of the fourth supporting ribs at a same side.

In an optional embodiment of the present application, two first bumps are disposed on opposite inner walls of the middle frame, and the two first bumps are parallel to the plurality of first supporting member ribs; and wherein each of opposite ends of the sliding assembly is respectively provided with an engaging groove, two of the engaging groove are respectively engaged on the two first bumps, and the sliding assembly is slidable along the first bumps.

In an optional embodiment of the present application, each of the rolling mechanisms includes:

two reel drums, wherein each of the reel drums has a first opening, the second supporting member and the third supporting member are respectively fixed on outer walls of the two reel drums, and each of opposite ends of each of the reel drums is respectively fixed with one of end caps;

two winding drums, wherein each of the winding drums is accommodated in one of the reel drums, and each of the winding drums includes a reel, opposite ends of the reel are respectively rotatably connected to the end caps at opposite ends of the reel drums, the opposite ends of the flexible screen are respectively wound around the reel, each of the reel drums has a second opening opposite to the first opening, and the flexible screen enters and exits the winding drums from the first opening and the second opening;

two damping members, wherein each of the damping members is sleeved on one end of the reel and abuts against one of the end caps; and two coil springs, wherein each of the coil springs is sleeved on another end of the reel and abuts against another one of the end caps.

The present application also provides a terminal device, including a driving mechanism; the terminal device further includes a rollable flexible display device, and the driving mechanism is connected to a transmission mechanism of the rollable flexible display device to drive the transmission mechanism;

wherein the rollable flexible display device includes:

a flexible screen;

two rolling mechanisms, wherein opposite ends of the flexible screen are respectively wound in the two rolling mechanisms;

a supporting mechanism including a first supporting member, a second supporting member, and a third supporting member, wherein one end of the second supporting member and one end of the third supporting member are respectively fixed on one of the rolling mechanisms, the second supporting member and the third supporting member are respectively embedded in the first supporting member; and a transmission mechanism fixed on the supporting mechanism and capable of driving the second supporting member and the third supporting member to synchronously telescope in opposite directions inside the first supporting member.

The rollable flexible display device provided by the present application includes two rolling mechanisms, a supporting mechanism, and a transmission mechanism. The supporting mechanism includes a first supporting member, a second supporting member, and a third supporting member. One end of the second supporting member and one end of the third supporting member are respectively fixed on one of the rolling mechanisms, and the second supporting member and the third supporting member are respectively embedded in the first supporting member. The transmission mechanism is fixed on the supporting mechanism and capable of driving the second supporting member and the third supporting member to synchronously telescope in opposite directions inside the first supporting member, so that the rollable flexible display device becomes a bilaterally rollable and retractable flexible display device. When the second supporting member and the third supporting member are stored in the first supporting member, the rollable flexible display device is in a first display mode; and when the second supporting member and the third supporting member are pulled out from the first supporting member, the rollable flexible display device is in a second display mode, and a display area of the rollable flexible display device in the second display mode is 3 times a display area of the rollable flexible display device in the first display mod, so that the rollable flexible display device in the second display mode has a larger display area.

In addition, the second supporting member and the third supporting member are transmitted through a cooperation of a gear and rack mechanism (first transmission member) and a screw mechanism (second transmission member). During stretching and contracting processes of the rack and gear mechanism, the rack and gear mechanism are driven synchronously and drives the sliding assembly through the screw rod, so that the second supporting member and the third supporting member can be pulled synchronously, thereby finally realizing gearing of the second supporting member and the third supporting member. The rollable flexible display device adopts the coil spring and the damping members to provide a screen rolling force for a flexible screen, so that the flexible screen can be tensioned at all times without floating.

BRIEF DESCRIPTION OF DRAWINGS

In order to more clearly illustrate the technical solutions of the embodiments of the application, the drawings illustrating the embodiments will be briefly described below. Obviously, the drawings in the following description merely illustrate some embodiments of the present application. Other drawings may also be obtained by those skilled in the art according to these figures without paying creative work.

DETAILED DESCRIPTION OF PREFERRED EMBODIMENTS

Figure 1:
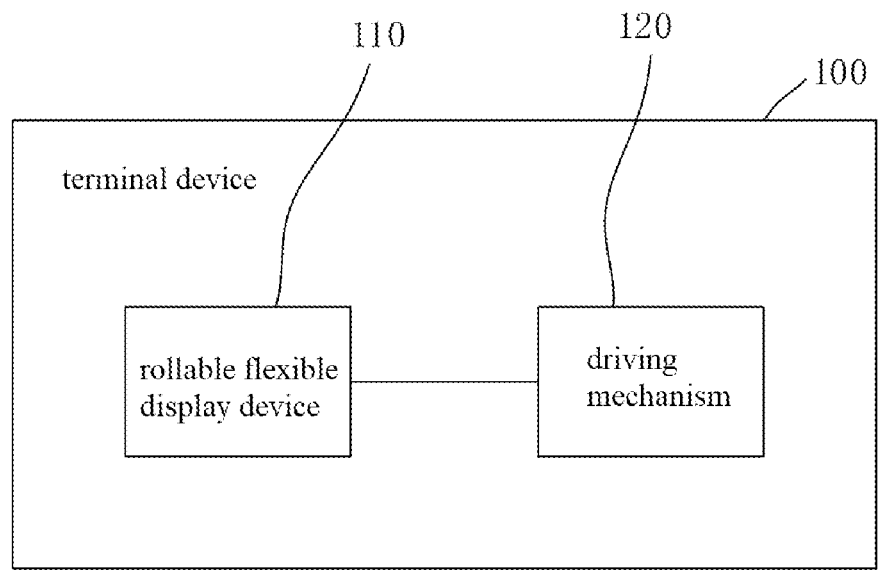
FIG. 1 is a schematic diagram of a terminal equipment provided by a preferred embodiment of the present application.
Figure 2:
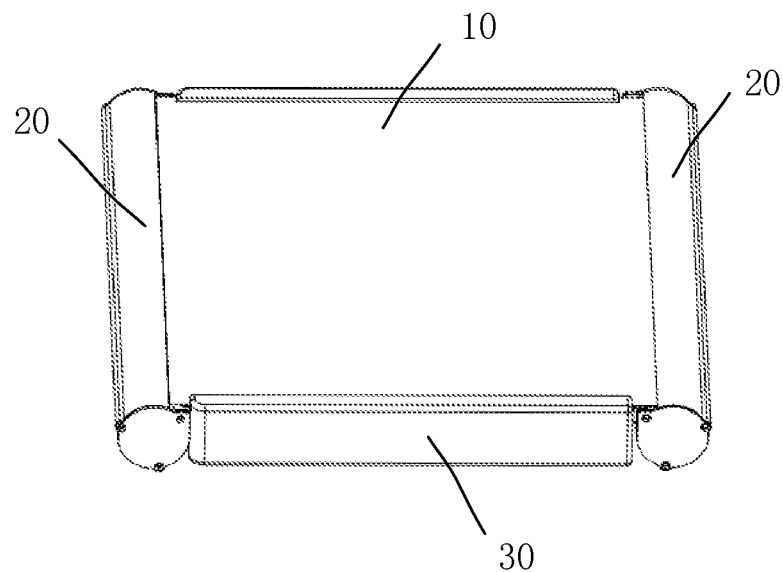
FIG. 2 is a schematic diagram of a rollable flexible display device in a first display state in the terminal equipment shown in FIG. 1.

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application.

In the description of this application, it should be understood that the terms "center", "longitudinal", "transverse", "length", "width", "thickness", "upper", "lower", "front", "Rear", "left", "right", "vertical", "horizontal", "top", "bottom", "inside", "outside", "clockwise", "counterclockwise", and the like are based on the orientation or positional relationship shown in the drawings, and is merely for the convenience of describing the present application and simplifying the description, rather than indicating or implying that the device or element referred to must have a specific orientation, structure and operation in a specific orientation, which should not be construed as limitations on the present application. In addition, the terms "first" and "second" are used for descriptive purposes only, and cannot be understood as indicating or implying relative importance or implicitly indicating the number of technical features indicated. Therefore, the features defined as "first" and "second" may explicitly or implicitly include one or more of the features. In the description of the present application, the meaning of "a plurality" is two or more, unless specifically defined otherwise.

The present application may repeat reference numerals and/or reference letters in different examples. Such repetition is for the purpose of simplification and clarity, and does not indicate the relationship between the various embodiments and/or settings discussed.

In view of the technical problem that the existing rollable display device has only one display state and a small display area, the present application provides a rollable flexible display device, which becomes a bilaterally rollable and retractable flexible display device by providing a first supporting member, a second supporting member, and a third supporting member, and making the second supporting member and the third supporting member capable of synchronously and bilaterally sliding inside the first supporting member. When the second supporting member and the third supporting member are stored in the first supporting member, the rollable flexible display device is in a first display mode; and when the second supporting member and the third supporting member are pulled out from the first supporting member, the rollable flexible display device is in a second display mode, and a display area of the rollable flexible display device in the second display mode is 3 times, a display area of the rollable flexible display device in the first display mod, so that the rollable flexible display device in the second display mode has a larger area.

Referring to FIG. 1, a preferred embodiment of the present application provides a terminal device 100. The terminal device 100 includes a rollable flexible display device 110 and a driving mechanism 120 connected to the rollable flexible display device 110.

Referring to FIGS. 2-10, the rollable flexible display device 110 includes a flexible screen 10, two rolling mechanisms 20, a supporting mechanism 30, and a transmission mechanism 40. Opposite ends of the flexible screen 10 are respectively wound in the two rolling structures 20, the supporting mechanism 30 is a telescopic supporting mechanism, and opposite ends of the supporting mechanism 30 are respectively fixed on one of the rolling mechanisms 20, the transmission mechanism 40 is fixed on the supporting mechanism 30 and can drive the supporting mechanism 30 to make a telescopic movement.

Figure 6:
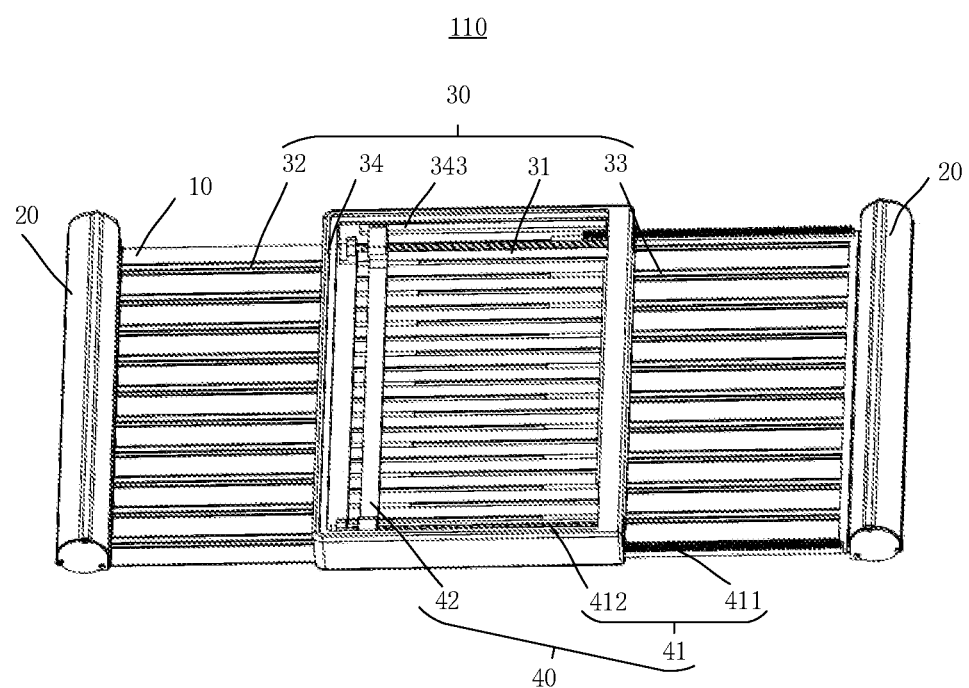
FIG. 6 is a schematic diagram of the rollable flexible display device shown in FIG. 5 after being turned 180°.
Figure 10:
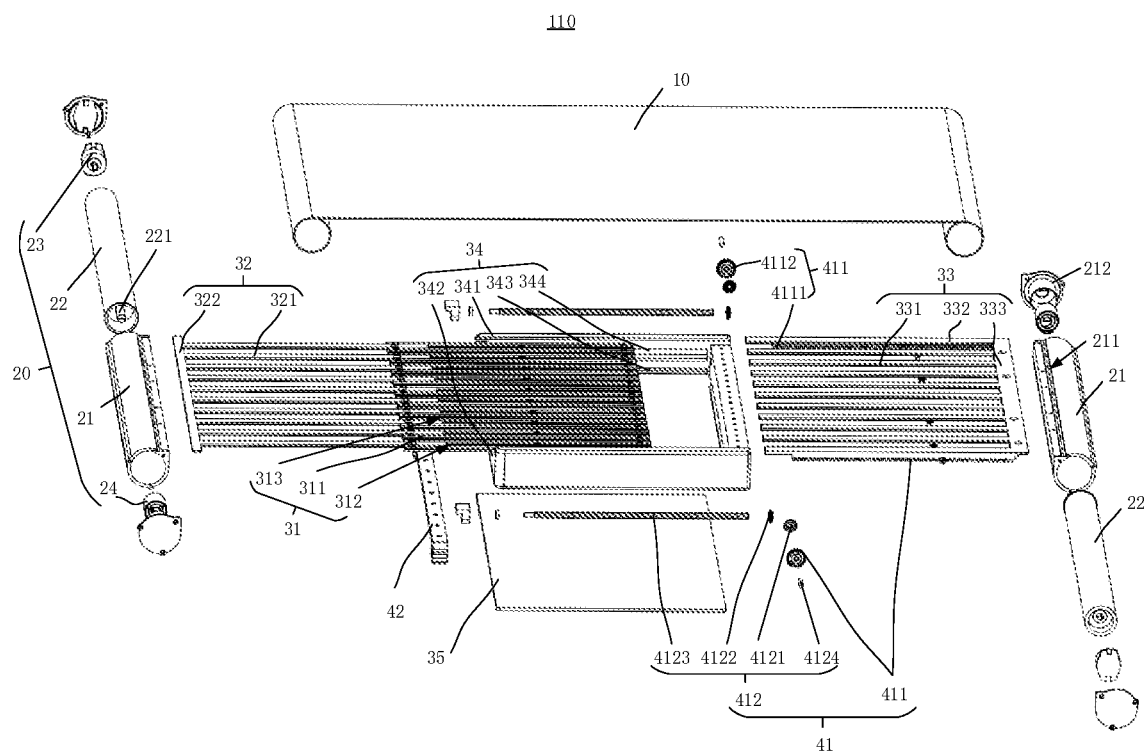
FIG. 10 is an exploded view of the rollable flexible display device shown in FIG. 5.

Referring to FIGS. 6 and 10, the supporting mechanism 30 includes a first supporting member 31, a second supporting member 32, a third supporting member 33, and a middle frame 34. The first supporting member 31 is fixed in the middle frame 34, one end of the second supporting member 32 and one end of the third supporting member 33 are respectively fixed on outer walls of the reel drums 21, the second supporting member 32 and the third supporting member 33 respectively pass through the middle frame 34 and are respectively embedded in the first supporting member 31. The transmission mechanism 40 is fixed on the supporting mechanism 30 and can drive the second supporting member 32 and the third supporting member 33 to synchronously telescope in opposite directions inside the first supporting member 31.

Areas of the first supporting member 31, the second supporting member 32 and the third supporting member 33 are equal.

Specifically, in an optional embodiment of the present application, the first supporting member 31 includes a plurality of first supporting ribs 311, and opposite ends of the plurality of first supporting ribs 311 are respectively fixed on the middle frame 34, and the plurality of the first supporting member ribs 311 are arranged in parallel at intervals to form a first slide 312 or a second slide 313 between adjacent ones of the first supporting member ribs 311.

In an optional embodiment of the present application, the first slide 312 and the second slide 313 are arranged at intervals, so that the flexible screen 10 can be better supported.

In other optional embodiments of the present application, the first slide 312 and the second slide 313 may not be arranged at intervals. For example, one side is provided with the first slide 312 and another side is provided with the second slide 313; or two second slides 313 are provided between the two first slides 312.

The second supporting member 32 includes a plurality of second supporting ribs 321 arranged in parallel at intervals, and each of the second supporting ribs 321 is embedded in the first slide 312 and slidable in the first slide 312.

The second supporting member 32 further includes a first fixing rib 322, the second supporting rib 321 is vertically fixed on the first fixing rib 322, and an end of the first fixing rib 322 away from the second supporting rib 321 is fixed on an outer wall of a reel drum 21.

The third supporting member 33 includes a plurality of third supporting ribs 331 arranged in parallel at intervals, and each of the third supporting ribs 331 is embedded in the second slide 313 and slidable in the second slide 313.

The third supporting member 33 further includes two fourth supporting ribs 332, the plurality of the third supporting ribs 331 are located between the two fourth supporting ribs 332, and any one of outermost two of the first supporting ribs 311 is located between one of the outermost two of the second supporting ribs 321 and one of the fourth supporting ribs 332 at a same side.

The third supporting member 33 further includes a second fixing rib 333, the third supporting rib 331 and the fourth supporting rib 332 are both vertically fixed on the second fixing rib 333, and one end of the second fixing rib 333 away from the third supporting rib 331 and the fourth supporting rib 332 is fixed on the outer wall of the reel drum 21.

In other optional embodiments of the present application, the first supporting member 31 may not include a plurality of the first supporting ribs 311, but is composed of a thin plate with a certain thickness, and the thin plate is provided with the first slide 312 and the second slide 313, so that the first slide 312 and the second slide 313 need not be arranged at intervals.

The first supporting member 31, the second supporting member 32, and the third supporting member 33 are composed of supporting ribs, which can reduce weights of the first supporting member 31, the second supporting member 32, and the third supporting member 33 to comply with a development trend of thinning of the rollable flexible display device 110.

Sliding directions of the second supporting member 32 and the third supporting member 33 in the first supporting member 31 are defined as a first direction, the first slide 312 and the second slide 313 extend along the first direction, and the first fixing rib 322 and the second fixing rib 333 are parallel to each other and extend along a second direction perpendicular to the first direction.

Still referring to FIG. 10, the middle frame 34 includes two first side walls 341 and two second side walls 342, and the two second side walls 342 are respectively connected to the first side walls 341.

Each first side wall 341 is provided with a first bump 343 and a second bump 344, and the first bump 343 and the second bump 344 on the same first side wall 341 are parallel to each other and all extend along the first direction. The two first bumps 343 are oppositely arranged, and the two second bumps 344 are oppositely arranged. The two first bumps 343 are disposed away from the first supporting member 31, the two second bumps 344 are disposed close to the first supporting member 31, and the two fourth supporting member ribs 332 are located at the two second bump 344 and capable of sliding on the two second bumps 344.

Figure 8:
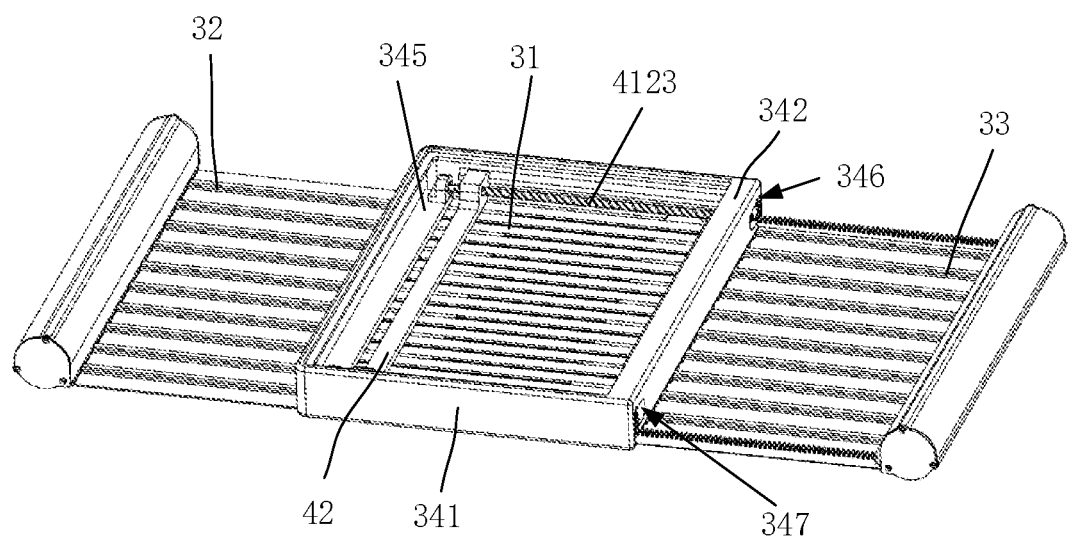
FIG. 8 is a schematic view from yet another view angle of the rollable flexible display device shown in FIG. 6.
Figure 9:
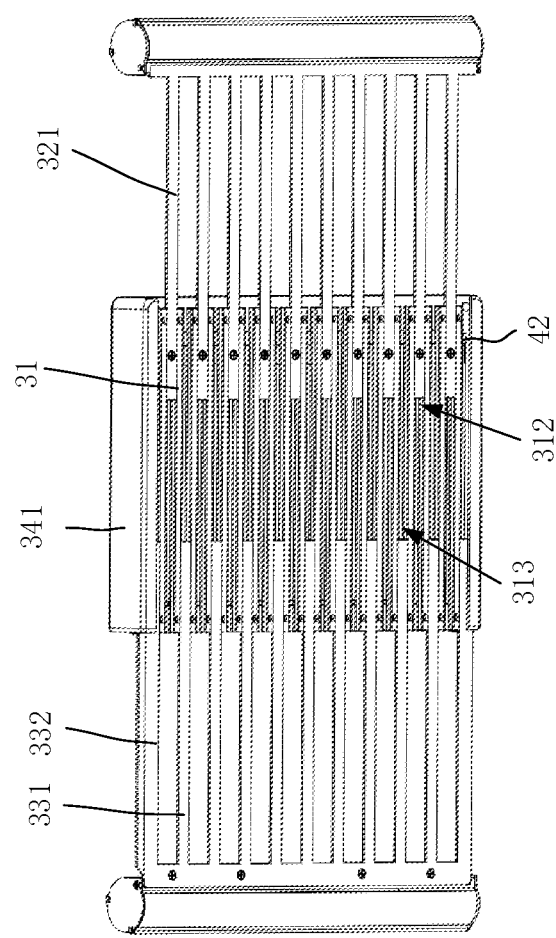
FIG. 9 is a schematic diagram of the rollable flexible display device shown in FIG. 5n absence of a flexible screen and a back cover.

Still referring to FIG. 8, each of the second side walls 342 is further provided with a supporting plate 345, and the two supporting plates 345 on the two second side walls 342 are arranged opposite to each other. The supporting plates 345 are disposed close to the first supporting member 31.

Figure 7:
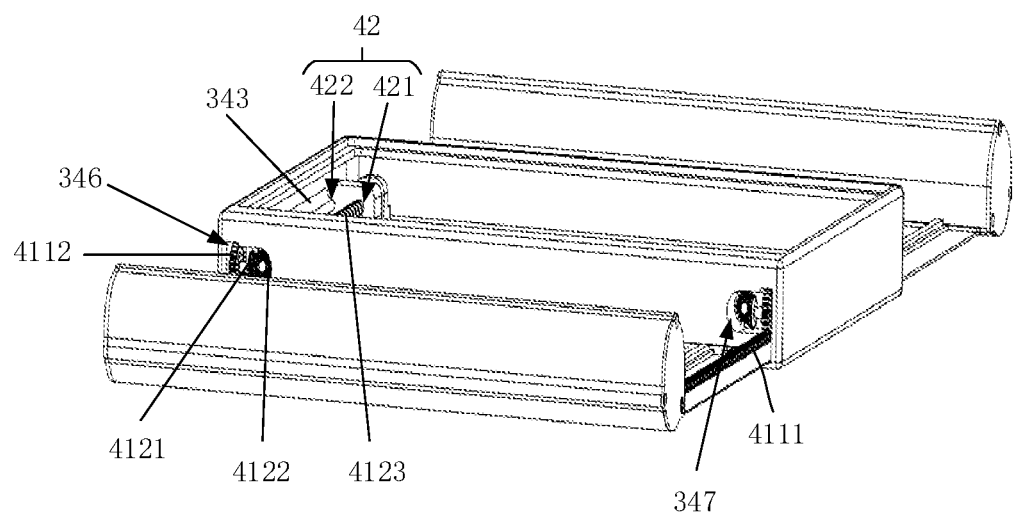
FIG. 7 is a schematic view from another view angle of the rollable flexible display device shown in FIG. 6.

Still referring to FIGS. 7-8, the second side wall 342 of the middle frame 34 is further provided with a through groove 346 and a receiving groove 347, and the through groove 346 is in communication with the receiving groove 347. An inner wall of the receiving groove 347 also has a through hole (not shown), and the through hole is used to receive one end of the screw rod (as described below) of the transmission mechanism 40.

Still referring to FIG. 10, the supporting mechanism 30 also includes a back cover 35, the back cover 35 is fixed on the middle frame 34 and covers the first supporting member 31, and the back cover 35 faces the flexible screen 10. The back cover 35 is configured to ensure a flatness of the flexible screen 10.

Referring to FIGS. 2-10, the transmission mechanism 40 includes a transmission assembly 41 and a sliding assembly 42. One end of the transmission assembly 41 is fixed on the third supporting member 33, and another end of the transmission assembly 41 is fixed on the first supporting member 31. One end of the sliding assembly 42 is fixed on the transmission assembly 41, and another end of the sliding assembly 42 is fixed on the second supporting member 32. The transmission assembly 41 can drive the third supporting member 33 to slide in the second slide 313 and drive the second supporting member 32 to slide in the first slide 312 through the slide assembly 42.

Referring to FIG. 10, the transmission assembly 41 includes two first transmission members 411 and two second transmission members 412.

Each of the first transmission members 411 includes a rack 4111 and an active gear 4112 meshed with the rack 4111, and the rack 4111 is fixed on the fourth supporting member rib 332 of the third supporting member 33. The active gear 4112 is fixed on the middle frame 34. The rack 4111 passes through the through groove 346 and slidable in the through groove 346, and the active gear 4112 is accommodated in the through groove 346.

Referring to FIG. 10 and FIG. 8, each of the second transmission members 412 includes a first young gear 4121, a second young gear 4122, and a screw rod 4123. The first young gear 4121 is fixed on the active gear 4112. The second young gear 4122 is fixed on one end of the screw rod 4123 and meshes with the first gear 4121, and another end of the screw rod 4123 is fixed on the support plate 345 by a fixing block 4124. Opposite ends of the sliding assembly 42 are respectively screwed on two screw rods 4123, and the active gear 4112 drives the screw rods 4123 to rotate through the first young gear 4121 and the second young gear 4122. The rotation of the screw rods 4123 drive the sliding assembly 42 to slide on the screw rod 4123. The first young gear 4121 and the second young gear 4122 are both accommodated in the receiving groove 347, and the second young gear 4122 is sleeved and fixed on one end of the screw rod 4123 that passes through the through hole.

The rack 4111 and the screw rod 4123 both extend in the first direction, the active gear 4112 is connected to the active gear 4112 and the first gear 4121 via a transmission shaft 4124, and the transmission shaft 4124 extends in the second direction.

Referring to FIG. 9 again, the sliding assembly 42 extends along the second direction and is fixed on the second supporting rib 321.

Referring to FIGS. 7-8 again, each of opposite ends of the sliding assembly 42 respectively has a screw hole 421, and two of the screw rods 4123 respectively pass through two of the screw holes 421 and screwed to two of the screw holes 421.

Each of the opposite ends of the sliding assembly 42 has an engaging groove 422, and two of the engaging grooves 422 are respectively engaged with two of the first bumps 343, and the sliding assembly 42 slides along the first bump 343.

Referring to FIGS. 6 and 10 again, each of the rolling mechanisms 20 includes two reel drums 21, two winding drums 22, two damping members 23, and two coil springs 24.

Each of the reel drums 21 has a first opening 211, and opposite ends of each of the reel drums 21 are respectively fixed with one of end caps 212. Opposite ends of the supporting mechanism 30 are respectively fixed on an outer wall of the reel drum 21.

Each of the winding drums 22 is accommodated in one of the reel drums 21, each of the winding drums 22 includes a reel 221, opposite ends of the reel 221 are respectively rotatably connected to the end caps 212 at opposite ends of the reel drums 21. Opposite ends of the flexible screen 10 are respectively wound on the reel 221, and each of the winding drums 22 has a second opening (not shown) opposite to the first opening 211. The flexible screen 10 enters and exits the reel drums 21 and the winding drums 22 from the first opening 211 and the second opening. Each of the damping members 23 is sleeved on one end of the reel 221 and abuts against one of the end caps 212. Each of the coil springs 24 is sleeved on the other end of one of the reels 221 and abuts against the other end cap 212. The rollable flexible display device 110 adopts the coil springs 24 and the damping members 23 to provide a screen rolling force for the flexible screen 10, so that the flexible screen 10 can be tensioned at all times without floating.

Figure 3:
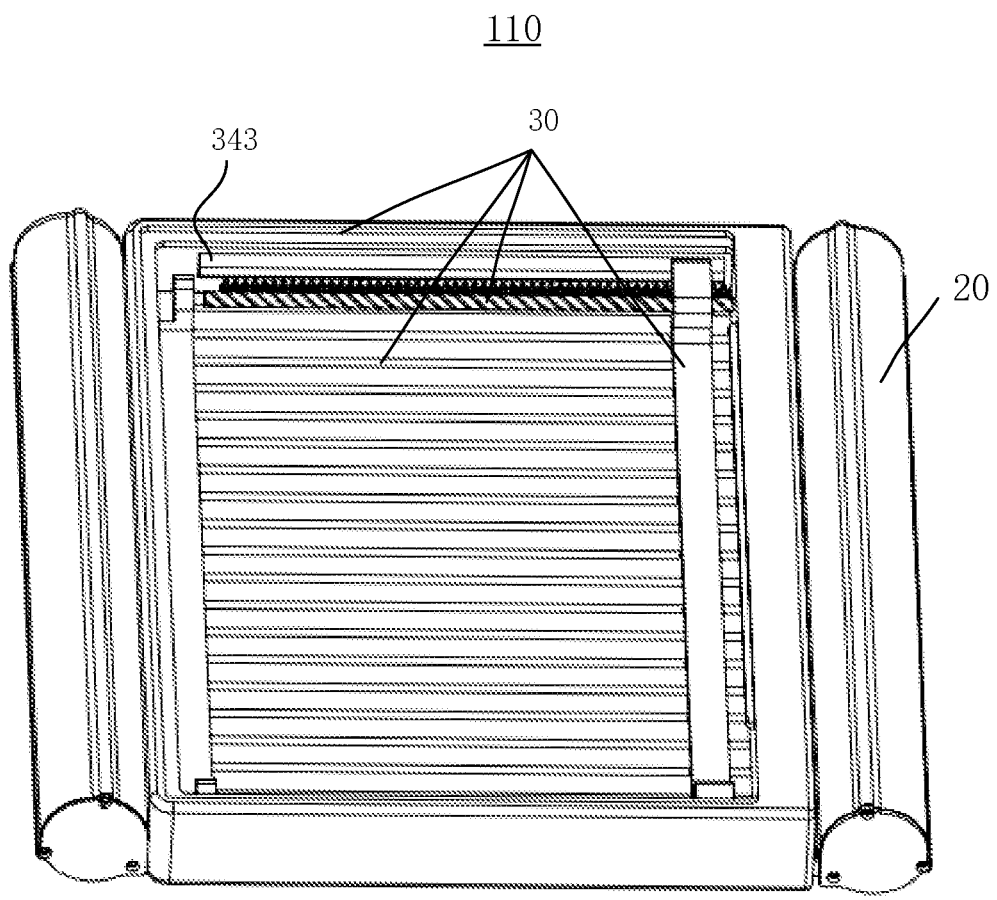
FIG. 3 is a schematic diagram of the rollable flexible display device shown in FIG. 2 after being turned 180°.
Figure 4:
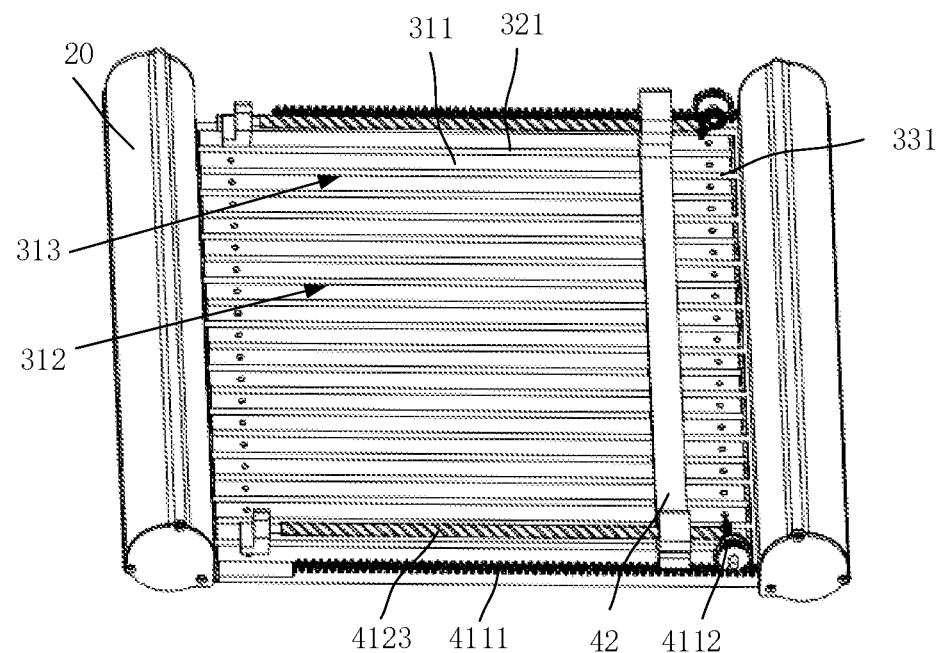
FIG. 4 is a schematic diagram of the rollable flexible display device shown in FIG. 3 in absence of a middle frame.
Figure 5:
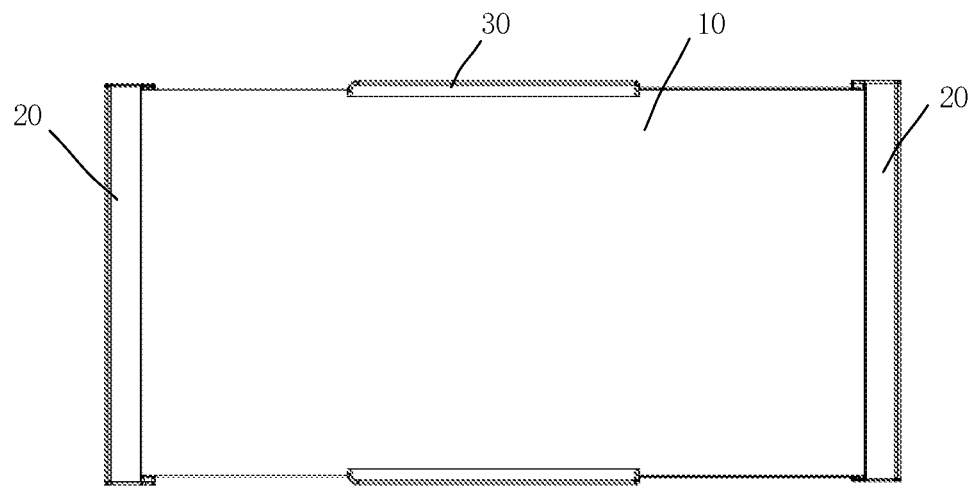
FIG. 5 is a schematic diagram of the rollable flexible display device in a second display state according to a preferred embodiment of the present application.

Referring to FIGS. 1 and 3 to 4, when the driving assembly 120 drives or manually drives the third supporting member 33 into the second slide 313, the rack 4111 drives the active gear 4112 to rotate, the active gear 4112 drives the first young gear 4121 to rotate, the first young gear 4121 drives the second young gear 4122 to rotate, the second young gear 4122 drives the screw rod 4123 to rotate, the screw rod 4123 drives the sliding assembly 42 to slide toward the active gear 4112, and the sliding assembly 42 drives the second supporting member 32 to slide in the first slide 312. When the sliding assembly 42 is located at one end of the screw rod 4123 close to the active gear 4112, the second supporting member 32 is completely accommodated in the first slide 312, and the rollable flexible display device 110 is in the first display state, a display area of the rollable flexible display device 110 is equal to an area of the first supporting member 31 at this time.

Referring to FIG. 1, FIG. 6, and FIG. 8, when the driving assembly 120 drives or manually drives the third supporting member 33 to slide out of the second slide 313, the rack 4111 drives the active gear 4112 to rotate in an opposite direction, the active gear 4112 drives the first young gear 4121 to rotate in the opposite direction, the first young gear 4121 drives the second young gear 4122 to rotate in the opposite direction, and the second young gear 4122 drives the screw rod 4123 to rotate in the opposite direction, the screw rod 4123 drives the sliding assembly 42 to slide away from the active gear 4112, and the sliding assembly 42 drives the second supporting member 32 to slide in the opposite direction in the first slide 312. When the sliding assembly 42 is located at the end of the screw rod 4123 far away from the active gear 4112, the flexible screen 10 is fully unfolded, and the rollable flexible display device 110 is in the second display state. At this time, the display area of the rollable flexible display device 110 is equal to the area of the first supporting member 31, the second supporting member 32, and the third supporting member 33. That is, the display area of the rollable flexible display device 110 at this time is three times the display area of the rollable flexible display device 110 in the first display state.

The rollable flexible display device provided by the present application includes two rolling mechanisms, a supporting mechanism, and a transmission mechanism. The supporting mechanism includes a first supporting member, a second supporting member, and a third supporting member. One end of the second supporting member and one end of the third supporting member are respectively fixed on one of the rolling mechanisms, and the second supporting member and the third supporting member are respectively embedded in the first supporting member. The transmission mechanism is fixed on the supporting mechanism and capable of driving the second supporting member and the third supporting member to synchronously telescope in opposite directions inside the first supporting member, so that the rollable flexible display device becomes a bilaterally rollable and retractable flexible display device. When the second supporting member and the third supporting member are stored in the first supporting member, the rollable flexible display device is in a first display mode; and when the second supporting member and the third supporting member are pulled out from the first supporting member, the rollable flexible display device is in a second display mode, and a display area of the rollable flexible display device in the second display mode is 3 times, a display area of the rollable flexible display device in the first display mod, so that the rollable flexible display device in the second display mode has a larger display area. In addition, the second supporting member and the third supporting member are transmitted through a cooperation of a gear and rack mechanism (first transmission member) and a screw mechanism (second transmission member). During a telescopeion process of the rack and gear mechanism, the rack and gear mechanism are driven synchronously and drives the sliding assembly through the screw rod, so that the second supporting member and the third supporting member can be pulled synchronously, thereby finally realizing a linkage of the second supporting member and the third supporting member. The rollable flexible display device adopts the coil spring and the damping members to provide a screen rolling force for a flexible screen, so that the flexible screen can be tensioned at all times without floating.

While the application has been described by way of example and in terms of the preferred embodiments, it is to be understood that the application is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A rollable flexible display device, comprising:
   a flexible screen;
   two rolling mechanisms, wherein opposite ends of the flexible screen are respectively wound in the two rolling mechanisms;
   a supporting mechanism comprising a first supporting member, a second supporting member, and a third supporting member, wherein one end of the second supporting member and one end of the third supporting member are respectively fixed on one of the rolling mechanisms, the second supporting member and the third supporting member are respectively embedded in the first supporting member; and
   a transmission mechanism fixed on the supporting mechanism and capable of driving the second supporting member and the third supporting member to synchronously telescope in opposite directions inside the first supporting member;
   wherein the first supporting member comprises a plurality of first slides and a plurality of second slides, the first slides and the second slides are disposed adjacent at intervals in a direction perpendicular to a sliding direction of the second supporting member and the third supporting member, the second supporting member is slidable within the first slides, and the third supporting member is slidable within the second slides;
wherein the transmission mechanism comprises:
a transmission assembly, wherein one end of the transmission assembly is fixed on the third supporting member, and another end of the transmission assembly is fixed on the first supporting member; and
a sliding assembly, wherein one end of the sliding assembly is fixed on the transmission assembly, and another end of the sliding assembly is fixed on the second supporting member,
wherein the transmission assembly is capable of driving the third supporting member to telescope inside the first supporting member, and driving the sliding assembly to telescope inside the first supporting member through the second supporting member; and
wherein the transmission assembly comprises:
two first transmission members, wherein each of the first transmission members comprises a rack and an active gear meshed with the rack, the rack is fixed on the third supporting member, and the active gear is fixed on the first supporting member; and
two second transmission members, wherein each of the second transmission members comprises a first young gear, a second young gear, and a screw rod, the first young gear is fixed on the active gear, the second young gear is fixed at one end of the screw rod and meshed with the first gear, opposite ends of the sliding assembly are respectively screwed on two of the screw rod, and the active gear drives the sliding assembly to slide on the screw rod through the first gear and the second gear;
wherein a sliding direction of each of the second supporting member and the third supporting member in the first supporting member is defined as a first direction, and the rack and the screw rod extend in the first direction, the sliding assembly extends in a second direction perpendicular to the first direction, the active gear is connected to the active gear and the first gear through a transmission shaft, and the transmission shaft extends in the second direction.

2. The rollable flexible display device according to claim 1, wherein the supporting mechanism further comprises a middle frame;
the first supporting member is fixed on the middle frame;
the second supporting member comprises a plurality of second supporting ribs arranged in parallel at intervals, each of the second supporting ribs is embedded in the first slides and slidable in the first slides; and
the third supporting member comprises a plurality of third supporting ribs arranged in parallel at intervals, and each of the third supporting ribs is embedded in the second slides and slidable in the second slides.

3. The rollable flexible display device according to claim 2, wherein the first supporting member further comprises a plurality of first supporting ribs, and opposite ends of the plurality of first supporting ribs are respectively fixed on the middle frame, the plurality of the first supporting ribs are arranged in parallel at intervals to form the first slide and the second slide between adjacent ones of the first supporting ribs, and the first slide and the second slide are arranged at intervals.

4. The rollable flexible display device according to claim 3, wherein the third supporting member further comprises two fourth supporting ribs, the plurality of the third supporting ribs are located between the two fourth supporting ribs, two of the rack are respectively fixed on the two fourth supporting ribs, and any one of outermost two of the first supporting ribs is located between one of the outermost two of the second supporting ribs and one of the fourth supporting ribs at a same side.

5. The rollable flexible display device according to claim 2, wherein two first bumps are disposed on opposite inner walls of the middle frame, and the two first bumps are parallel to the plurality of first support ribs; and wherein each of opposite ends of the sliding assembly is respectively provided with an engaging groove, two of the engaging groove are respectively engaged on the two first bumps, and the sliding assembly is slidable along the first bumps.

6. The rollable flexible display device according to claim 1, wherein each of the rolling mechanisms comprises:
two reel drums, wherein each of the reel drums has a first opening, the second supporting member and the third supporting member are respectively fixed on outer walls of the two reel drums, and each of opposite ends of each of the reel drums is respectively fixed with one of end caps;
two winding drums, wherein each of the winding drums is accommodated in one of the reel drums, and each of the winding drums comprises a reel, opposite ends of the reel are respectively rotatably connected to the end caps at opposite ends of the reel drums, the opposite ends of the flexible screen are respectively wound around the reel, each of the reel drums has a second opening opposite to the first opening, and the flexible screen enters and exits the winding drums from the first opening and the second opening;
two damping members, wherein each of the damping members is sleeved on one end of the reel and abuts against one of the end caps; and
two coil springs, wherein each of the coil springs is sleeved on another end of the reel and abuts against another one of the end caps.

7. A terminal device, comprising a driving mechanism; wherein the terminal device further comprises a rollable flexible display device, and the driving mechanism is connected to a transmission mechanism of the rollable flexible display device to drive the transmission mechanism;
wherein the rollable flexible display device comprises:
a flexible screen;
two rolling mechanisms, wherein opposite ends of the flexible screen are respectively wound in the two rolling mechanisms;
a supporting mechanism comprising a first supporting member, a second supporting member, and a third supporting member, wherein one end of the second supporting member and one end of the third supporting member are respectively fixed on one of the rolling mechanisms, the second supporting member and the third supporting member are respectively embedded in the first supporting member; and
a transmission mechanism fixed on the supporting mechanism and capable of driving the second supporting member and the third supporting member to synchronously telescope in opposite directions inside the first supporting member;
wherein the first supporting member comprises a plurality of first slides and a plurality of second slides, the first slides and the second slides are disposed adjacent at intervals in a direction perpendicular to a sliding direction of the second supporting member and the third supporting member, the second supporting member is slidable within the first slides, and the third supporting member is slidable within the second slides;

wherein the transmission mechanism comprises:
transmission assembly, wherein one end of the transmission assembly is fixed on the third supporting member, and another end of the transmission assembly is fixed on the first supporting member; and
sliding assembly, wherein one end of the sliding assembly is fixed on the transmission assembly, and another end of the sliding assembly is fixed on the second supporting member,
wherein the transmission assembly is capable of driving the third supporting member to telescope inside the first supporting member, and driving the sliding assembly to telescope inside the first supporting member through the second supporting member; and
wherein the transmission assembly comprises:
two first transmission members, wherein each of the first transmission members comprises a rack and an active gear meshed with the rack, the rack is fixed on the third supporting member, and the active gear is fixed on the first supporting member; and
two second transmission members, wherein each of the second transmission members comprises a first young gear, a second young gear, and a screw rod, the first young gear is fixed on the active gear, the second young gear is fixed at one end of the screw rod and meshed with the first gear, opposite ends of the sliding assembly are respectively screwed on two of the screw rod, and the active gear drives the sliding assembly to slide on the screw rod through the first gear and the second gear.

8. The terminal device according to claim 7, wherein a sliding direction of each of the second supporting member and the third supporting member in the first supporting member is defined as a first direction, and the rack and the screw rod extend in the first direction, the sliding assembly extends in a second direction perpendicular to the first direction, the active gear is connected to the active gear and the first gear through a transmission shaft, and the transmission shaft extends in the second direction.

9. The terminal device according to claim 7, wherein the supporting mechanism further comprises a middle frame;
the first supporting member is fixed on the middle frame;
the second supporting member comprises a plurality of second supporting ribs arranged in parallel at intervals, each of the second supporting ribs is embedded in the first slides and slidable in the first slides; and
the third supporting member comprises a plurality of third supporting ribs arranged in parallel at intervals, and each of the third supporting ribs is embedded in the second slides and slidable in the second slides.

10. The terminal device according to claim 9, wherein the first supporting member further comprises a plurality of first supporting ribs, and opposite ends of the plurality of first supporting ribs are respectively fixed on the middle frame, the plurality of the first supporting ribs are arranged in parallel at intervals to form the first slide and the second slide between adjacent ones of the first supporting ribs, and the first slide and the second slide are arranged at intervals.

11. The terminal device according to claim 10, wherein the third supporting member further comprises two fourth supporting ribs, the plurality of the third supporting ribs are located between the two fourth supporting ribs, two of the rack are respectively fixed on the two fourth supporting ribs, and any one of outermost two of the first supporting ribs is located between one of the outermost two of the second supporting ribs and one of the fourth supporting ribs at a same side.

12. The terminal device according to claim 9, wherein two first bumps are disposed on opposite inner walls of the middle frame, and the two first bumps are parallel to the plurality of first support ribs; and wherein each of opposite ends of the sliding assembly is respectively provided with an engaging groove, two of the engaging groove are respectively engaged on the two first bumps, and the sliding assembly is slidable along the first bumps.

13. The terminal device according to claim 7, wherein each of the rolling mechanisms comprises:
two reel drums, wherein each of the reel drums has a first opening, the second supporting member and the third supporting member are respectively fixed on outer walls of the two reel drums, and each of opposite ends of each of the reel drums is respectively fixed with one of end caps;
two winding drums, wherein each of the winding drums is accommodated in one of the reel drums, and each of the winding drums comprises a reel, opposite ends of the reel are respectively rotatably connected to the end caps at opposite ends of the reel drums, the opposite ends of the flexible screen are respectively wound around the reel, each of the reel drums has a second opening opposite to the first opening, and the flexible screen enters and exits the winding drums from the first opening and the second opening;
two damping members, wherein each of the damping members is sleeved on one end of the reel and abuts against one of the end caps; and
two coil springs, wherein each of the coil springs is sleeved on another end of the reel and abuts against another one of the end caps.

14. A rollable flexible display device, comprising:
a flexible screen;
two rolling mechanisms, wherein opposite ends of the flexible screen are respectively wound in the two rolling mechanisms;
a supporting mechanism comprising a first supporting member, a second supporting member, and a third supporting member, wherein one end of the second supporting member and one end of the third supporting member are respectively fixed on one of the rolling mechanisms, the second supporting member and the third supporting member are respectively embedded in the first supporting member; and
a transmission mechanism fixed on the supporting mechanism and capable of driving the second supporting member and the third supporting member to synchronously telescope in opposite directions inside the first supporting member;
wherein each of the rolling mechanisms comprises:
two reel drums, wherein each of the reel drums has a first opening, the second supporting member and the third supporting member are respectively fixed on outer walls of the two reel drums, and each of opposite ends of each of the reel drums is respectively fixed with one of end caps;
two winding drums, wherein each of the winding drums is accommodated in one of the reel drums, and each of the winding drums comprises a reel, opposite ends of the reel are respectively rotatably connected to the end caps at opposite ends of the reel drums, the opposite ends of the flexible screen are respectively wound around the reel, each of the reel drums has a second opening opposite to the first opening, and the flexible screen enters and exits the winding drums from the first opening and the second opening;

two damping members, wherein each of the damping members is sleeved on one end of the reel and abuts against one of the end caps; and two coil springs, wherein each of the coil springs is sleeved on another end of the reel and abuts against another one of the end caps.

* * * * *